United States Patent
Hung et al.

(10) Patent No.: US 6,971,055 B2
(45) Date of Patent: Nov. 29, 2005

(54) METHOD FOR VERIFYING THE ACCURACY OF BIT-MAP MEMORY TEST PROGRAMS

(75) Inventors: Wen-Jyh Hung, Hsinchu (TW); Chien-Chiang Wang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 415 days.

(21) Appl. No.: 10/251,963

(22) Filed: Sep. 23, 2002

(65) Prior Publication Data

US 2003/0191994 A1    Oct. 9, 2003

(30) Foreign Application Priority Data

Apr. 8, 2002  (TW) ................................ 91106939 A

(51) Int. Cl.⁷ ................ G06F 11/00; G06F 17/50; G11C 29/00
(52) U.S. Cl. ................ 714/743; 714/718; 716/4
(58) Field of Search ................ 714/743, 741, 714/738, 724, 718, 723, 32, 33, 37, 38, 42, 714/48, 49, 53; 716/1, 4, 5; 703/13, 14, 15, 703/23, 24, 26; 711/1, 2

(56) References Cited

U.S. PATENT DOCUMENTS

| | | | |
|---|---|---|---|
| 6,775,796 B2 * | 8/2004 | Finkler et al. | ............ 714/723 |
| 6,782,499 B2 * | 8/2004 | Osada et al. | ............ 714/733 |
| 2003/0046621 A1 * | 3/2003 | Finkler et al. | ............ 714/723 |
| 2003/0177424 A1 * | 9/2003 | Ninomiya et al. | ............ 714/718 |

* cited by examiner

*Primary Examiner*—Christine T. Tu
(74) *Attorney, Agent, or Firm*—Jiang Chyun IP Office

(57) ABSTRACT

A method for verifying the accuracy of bit-map memory test programs is disclosed, which employs a Focused Ion Beam (FIB) apparatus to make or break connections on one or more word lines or bit lines of the memory to be tested, causing abnormal data output from memory locations affected by such word lines or bit lines during FIB modeling. If abnormal data are also produced on the same electrical address corresponding to the physical memory address during the bit-map memory testing, that means the bit-mapping memory test program has passed the verification test, and it can be used to test other physical memory to check for any faulty address lines or memory cells; otherwise, the test program needs to be tuned through repeated correction process until the electrical addresses output from the test program match with the test pattern memory addresses.

8 Claims, 2 Drawing Sheets

FIG.2

| 1 | 2 | 3 | 4 | 5 | 6 | 7 | 8 |
|---|---|---|---|---|---|---|---|
|   |   |   |   |   |   |   |   |
|   |   |   |   |   |   |   |   |
|   |   |   |   |   |   |   |   |

FIG.3

| 8 | 7 | 6 | 5 | 1 | 2 | 3 | 4 |
|---|---|---|---|---|---|---|---|
|   |   |   |   |   |   |   |   |
|   |   |   |   |   |   |   |   |
|   |   |   |   |   |   |   |   |

FIG.4

| 1 | 5 | 2 | 6 | 3 | 7 | 4 | 8 |
|---|---|---|---|---|---|---|---|
|   |   |   |   |   |   |   |   |
|   |   |   |   |   |   |   |   |
|   |   |   |   |   |   |   |   |

METHOD FOR VERIFYING THE ACCURACY OF BIT-MAP MEMORY TEST PROGRAMS

BACKGROUND OF THE INVENTION

1. Field of the Invention

The present invention relates to a method for verifying the accuracy of bit-map memory test programs, especially a method that employs a Focused Ion Beam (FIB) apparatus to make or break connections of one or more word lines or bit lines of a physical memory. The FIB modeling result is then compared with that from the bit-map memory test program to verify whether the bit-map memory test program is reliable.

2. Description of Related Art

Each step in a memory manufacturing process has to undergo stringent quality control to produce a high and stable yield rate. When the yield rate drops below a normal standard, test engineers are called in to investigate the cause. Bit-map memory test programs are one of the more commonly used programs to test physical memory. The testing parameters for the bit-map memory test program first have to be setup according to the physical address table provided by the memory manufacturer. The data output pattern from the memory test program is regarded as the electrical address, which is supposed to match the corresponding physical address in the physical memory. The output of the bit-map memory test program displayed on a screen is represented by a stream of 0's and 1's in a specific pattern.

During bit-map memory testing, test data is first written into the physical memory, and then the data is read out of memory. If the tested memory is a good memory chip, the results of the test program should correspond to the test data written into specified memory locations. If faulty memory addresses or memory cells exist in the physical memory, the data values at those memory locations cannot be read, causing the corresponding data image to be different from the data input into the memory. Through such comparison of FIB modeling results and the bit-map memory test results, whether or not the bit-map memory test detects all faulty memory address lines and data cells in a memory chip can thus be verified.

It is absolutely important that the physical memory address table provided by the memory manufacturer be a complete match with the physical memory address. Only then, can the memory test program based on the physical memory address table be successfully performed on the physical memory with high accuracy. With reference to FIG. 2 to FIG. 4, current memory architecture allows physical memory addresses to be arranged in one of several ways. With reference to FIG. 2, the memory address can be arranged sequentially from left to right. With reference to FIG. 3, the data sequence can start at the center and extend to one side. When the data stream reaches the end of the line, the data sequence restarts from the center of the same line but extends in the opposite direction. With reference to FIG. 4, data can be alternately arranged from left to right the first time through, and then it is started again on the same line from left to right but in every other slot until the end of the line.

It only takes a small data discrepancy in the physical memory to render the tested memory useless, because the test program is unable to test all physical memories to produce a clean test report. To prevent such errors during memory testing with the bit-map memory test program, a verification process is developed in the present invention by means of Focused Ion Beam (FIB) apparatus, which can tell how accurate and reliable a bit-map memory test program is.

SUMMARY OF THE INVENTION

The main objective of the present invention is to provide a method for verifying the accuracy of bit-map memory test programs preferably through a Focused Ion Beam (FIB) modeling process. One or more word lines or bit lines of the physical memory are modified in the modeling process by either connecting or separating the address lines. The FIB modeling result is then compare to that from the bitmap memory test program to determine whether the data image of electrical addresses generated by the bit-map memory test program perfectly matches the physical address of the tested memory.

The second objective of the present invention is to provide a method for verifying the accuracy of bit-map memory test programs. If there are more than one possible representation for memory data, the memory test program and the FIB test pattern both have to be adjusted a limited number of times to be in sync with each other and to cover all possible memory data representations commonly used. The result of a bit-map memory test determines whether the electrical addresses correspond to the physical addresses of the physical memory.

In the memory testing process, a focused ion beam (FIB) apparatus is first set up to make or break connections of one or more word lines or bit lines of the physical memory in accordance with a test pattern. The test pattern memory addresses are then compared with the results of the bit-map memory test program to determine whether the data image represented by the bit-map memory test program is the same as expected. If yes, that means the bit-map memory test program has passed the verification test. Otherwise, the bit-map memory test program has to be tuned through a deviation-correction process. Therefore, the memory test program has to be modified and then tested again. Both FIB test pattern and the bit-map memory test have to be adjusted a limited number of times to be in sync with each other and to cover all possible data representations, until the bit-map test results perfectly match the FIB test pattern.

BRIEF DESCRIPTION OF THE DRAWINGS

FIG. 2 is a conventional data representation in association with physical memory address.

FIG. 3 is another conventional representation for the same physical memory address.

FIG. 4 is still another conventional representation for the same physical memory address.

DETAILED DESCRIPTION OF THE PREFERRED EMBODIMENT

Figure 1:
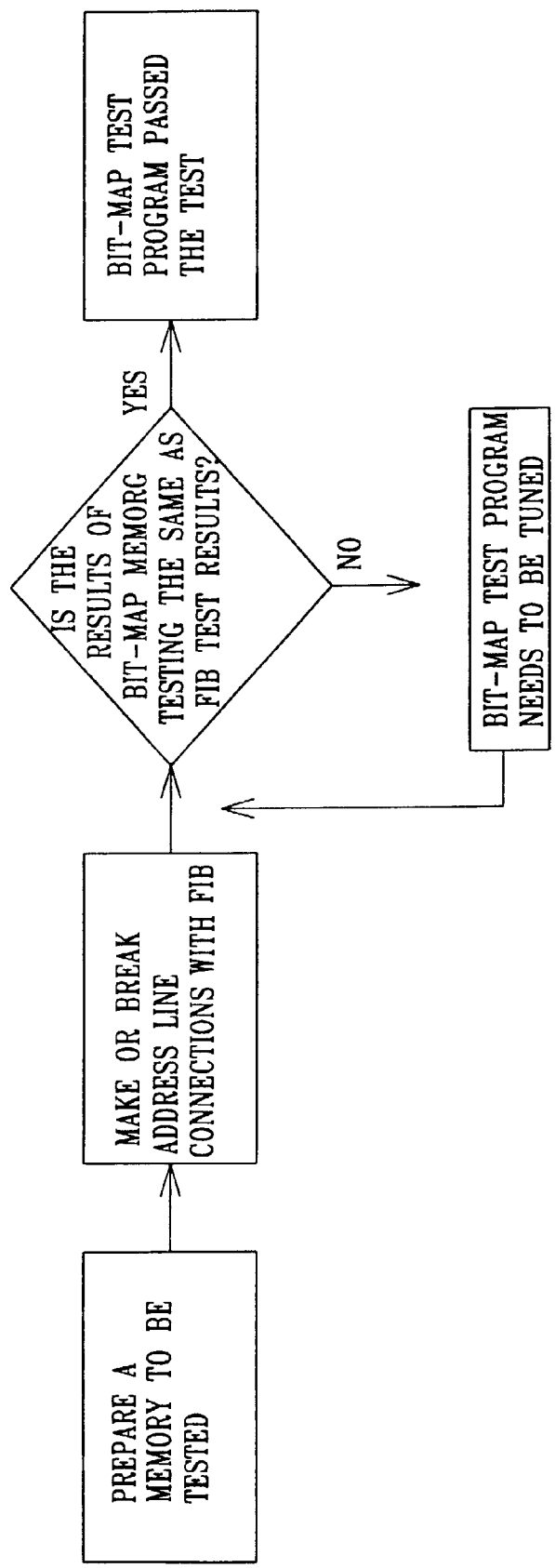
FIG. 1 is a logic diagram of the method for verification of bit-map memory test program in accordance with the present invention.

With reference to FIG. 1, the method for verifying the accuracy of a bit-map memory test program in accordance with the present invention includes the steps of:

(i) preparing a normal memory chip and setting up a bit-map memory test program by loading specific test parameters based on the manufacturer's physical memory address;

(ii) making or breaking connections of specific address lines of the physical memory in accordance with a test pattern using Focused Ion Beam apparatus;

(iii) executing the bit-map memory test program on the physical memory with modified memory addresses;

(iv) comparing the electrical addresses generated by the bit-map memory test program with the test pattern memory addresses;

(v) if the results from the above comparison show a perfect match, terminating the verification process since the bit-map test program has passed the verification test; if not, tuning the bit-map test program until the bit-map test program passes the test.

A normal memory chip is prepared to conduct bit-map memory test program verification by means of the method in accordance with the present invention, and the bit-map memory test program is set up according to the physical memory address table provided by the memory manufacturer. Then a focused ion beam (FIB) apparatus makes or breaks connections on the memory address lines by either connecting two selected word lines or bit lines, or breaking one or more selected word lines or bit lines. Closed/open circuits in memory address lines cause changes in the data pattern at these memory locations corresponding to the modified memory address lines during the FIB modeling. When data is read from these affected memory locations, the data image will be different from the rest. For example, if a selected word line in a memory chip is broken, regardless of the original data sequence of 0's and 1's, the data output corresponding to the selected word line will be all 0's or 1's and different from the data in adjacent memory addresses.

Figures 2, 3, 4:
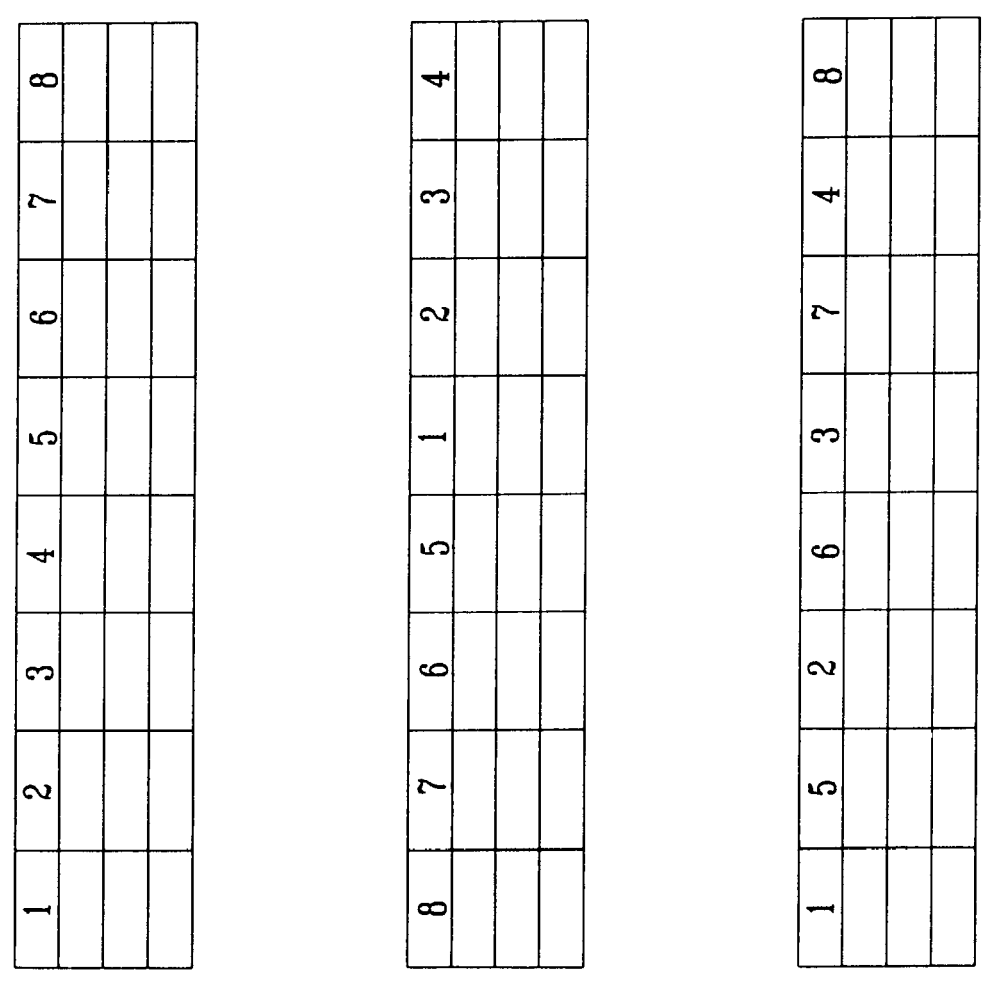

Certain address lines are modified by the FIB process in accordance with a test pattern. When the bit-map memory test program is run on a physical memory that has the same configuration, it should get an electrical address that matches the physical memory address. The data image, for example, may be either all 0's or 1's, as originally expected. If both results are a perfect match, it can be confirmed that the bit-map memory test program has passed the verification process, which means the electrical address corresponds to the physical address. If not, it means the electrical address does not match the physical address, and the bit-map memory test program has to be tuned through a deviation-correction process. Considering several memory data representations each with a unique sequencing order (as shown in FIGS. 2, 3, and 4), the FIB test pattern and the memory test program both have to be adjusted a limited number of times to be in sync with each other and to cover all possible data representations to ensure high reliability in using the bit-map memory test program.

The method in accordance with the present invention is applicable to a wide variety of physical memory chips, such as Mask ROM, flash memory, SRAM, DRAM, etc.

The foregoing illustration of the preferred embodiments in the present invention is intended to be illustrative only, under no circumstances should the scope of the present invention be so restricted.

What is claimed is:

1. A method for verifying the accuracy of a bit-map memory test programs, the method comprising:

providing memory chip and setting up a bit-map memory test program based on a physical memory address table according to the memory chip;

executing the bit-map memory test program for testing the memory chip, and if the bit-map memory test is not passed, making or breaking connections of a plurality of address lines of the memory chip at specific physical memory addresses in accordance with a test pattern;

executing the bit-map memory test program again on the memory chip with the test pattern; and comparing a plurality of electrical addresses generated by the bit-map memory test program with the physical memory addresses to verify the accuracy of the bit-map memory test program.

2. A method for verifying the accuracy of bit-map memory test programs as claimed in claim 1, wherein, when the bit-map memory test program shows an erroneous electrical address which does not correspond to the specific physical memory addresses in accordance with the test pattern, the bit-map memory test program has to be tuned through a deviation-correction process.

3. A method for verifying the accuracy of bit-map memory test programs as claimed in claim 1, wherein a focused ion beam (FIB) modeling process is employed to break connections on a selected address line or a plurality of selected address lines of the memory chip.

4. A method for verifying the accuracy of bit-map memory test programs as claimed in claim 1, wherein a focused ion beam (FIB) modeling process is employed to make connections between two selected address lines of the memory chip.

5. A method for verifying the accuracy of bit-map memory test programs as claimed in claim 1, wherein the memory chip is a Mask ROM.

6. A method for verifying the accuracy of bit-map memory test programs as claimed in claim 1, wherein the memory chip is a flash memory.

7. A method for verifying the accuracy of bit-map memory test programs as claimed in claim 1, wherein the memory chip is a SRAM.

8. A method for verifying the accuracy of bit-map memory test programs as claimed in claim 1, wherein the memory chip is a DRAM.

* * * * *